United States Patent [19]

Hill

[11] Patent Number: 4,995,060

[45] Date of Patent: Feb. 19, 1991

[54] CARD COUNTER WITH CARD COUNTING PRESET DATA ENTRY SYSTEM METHOD

[75] Inventor: James E. Hill, Wheeling, Ill.

[73] Assignee: Dynetics Engineering Corporation, Lincolnshire, Ill.

[21] Appl. No.: 476,556

[22] Filed: Feb. 7, 1990

Related U.S. Application Data

[62] Division of Ser. No. 246,516, Sep. 16, 1988.

[51] Int. Cl.[5] ...................... H03K 21/40; G06M 3/12; G06M 9/00

[52] U.S. Cl. .......................................... 377/8; 377/26; 377/28; 377/39; 235/487; 364/266.3; 364/403

[58] Field of Search ...................... 377/6, 8, 26, 28, 39; 235/487; 364/200, 403

[56] References Cited

U.S. PATENT DOCUMENTS

| | | | |
|---|---|---|---|
| 2,942,770 | 6/1960 | Eichorn | 229/101 |
| 2,995,729 | 8/1961 | Steele | 364/200 |
| 3,665,164 | 5/1972 | Beveridge et al. | 364/403 |
| 3,737,631 | 6/1973 | Harris | 364/403 |
| 3,784,802 | 1/1974 | Imai et al. | 364/403 |
| 3,824,378 | 7/1974 | Johnson et al. | 377/39 |
| 3,854,035 | 12/1974 | Tyler et al. | 235/471 |
| 3,944,794 | 3/1976 | Reehil et al. | 377/8 |
| 3,987,429 | 10/1976 | Manduley et al. | 377/8 |
| 4,017,830 | 4/1977 | Shigemori et al. | 377/8 |
| 4,105,914 | 8/1978 | Murata et al. | 377/8 |
| 4,128,256 | 12/1978 | Nagano et al. | 377/8 |
| 4,180,204 | 12/1979 | Koenig et al. | 235/385 |
| 4,253,014 | 2/1981 | Woodbine | 377/37 |
| 4,263,503 | 4/1981 | Bianco | 235/487 |
| 4,514,856 | 4/1985 | Asai et al. | 377/8 |
| 4,519,631 | 5/1985 | Stone et al. | 283/70 |
| 4,532,421 | 7/1985 | Sasaoka et al. | 377/8 |
| 4,535,463 | 8/1985 | Ito et al. | 377/8 |
| 4,537,421 | 7/1985 | Sasoaka et al. | 377/8 |
| 4,542,470 | 9/1985 | Mohan et al. | 377/8 |
| 4,549,750 | 10/1985 | Stone et al. | 283/79 |
| 4,563,739 | 1/1986 | Gerpheide et al. | 364/403 |
| 4,694,474 | 9/1987 | Dorman et al. | 377/6 |
| 4,704,517 | 11/1987 | Campisi et al. | 235/382 |
| 4,707,843 | 11/1987 | McDonald et al. | 377/8 |
| 4,805,199 | 2/1989 | Muramatsu | 377/39 |

OTHER PUBLICATIONS

Musashi Co., Ltd., "Tellac-50-PC Plastic Card Counter", Operation Manual, cover page and 9 pages, 1984.

Spartanics, Ltd., "Spartanics Model 64 Stak-Kounter", Promotional brochure, 4 pages, printed 2/83.

Dynetics Operating Instructions Manual entitled "Series 5002 Credit Card Counter", published 4-1-84, 2 pages.

Dynetics Sales Brochure entitled "The Series 5002 Credit Card Counter", published 9/85, 2 pages.

*Primary Examiner*—John S. Heyman

*Attorney, Agent, or Firm*—Potthast & Ring

[57] ABSTRACT

A card counter (10) prints card inventory information locally and communicates with a remote computer (43) for permanent storage and retrieval of inventory information. A microprocessor controller detects a counting error in response to the actual count failing to match a preset count, failing to match a precount information machine read from a machine readable precount label (130) attached to the cards (18), in the event of a phase error from a pair of parallel scanning card sensor circuits (58, 59) or if the final counts of the two card sensor circuits (58, 59) do not match. In the event of detection of a counting error, an error indication is provided and entry of the count into an accumulator memory is inhibited. The preset number is entered into memory by selectively entering an actual count into the preset memory. A pair of separate accumulators are provided for concurrently accumulating totals of two different groups of cards (18). The card sensor circuits (58, 59) are digitally filtered by the microprocessor (44) which also automatically performs self diagnostics to reduce counting errors due to malfunction. Malfunction of a scan drive motor (61) is reduced through provision of a slip clutch (FIGS. 10A and 10B). Alphanumeric display units are both electrically connected to the control circuit (FIG. 2) and releasibly, mechanically attached to a printed circuit board (112) of said control circuit (FIG. 2) by means of a multiline electrical connector (120) attached to the edge of the printed circuit board (112).

11 Claims, 18 Drawing Sheets

CARD COUNTER WITH CARD COUNTING PRESET DATA ENTRY SYSTEM METHOD

CROSS REFERENCE TO RELATED APPLICATION

This application is a division of U.S. Ser. No. 07/246,516 filed Sept. 16, 1988.

BACKGROUND OF THE INVENTION

This invention generally relates to item counters and, more specifically, to card counters, such as credit card counters, which automatically count the number of cards standing on edge in a box of cards for comparison to a preset member entered into a preset memory and means and methods of entering said preset data.

Card counters are well known in the credit card issuing industry where it is most important to keep strict inventory control of both embossed and blank credit cards to prevent credit card fraud. Examples of such counters and their assorted optical scanning systems and related circuitry are shown in U.S. Pat. Nos. of Mohan et al. 3,581,067 reissued as Re 27,869 on Jan. 1, 1974; 3,790,759 issued Feb. 5, 1974; 3,663,803 issued May 16, 1972; 3,813,523 issued May 28, 1974; 3,889,136 issued June 10, 1975 and 4,373,135 issued Feb. 8, 1983. Other counters and optical sensor systems are also shown in U.S. Pat. Nos. 4,384,195 of Nosler issued May 17, 1983; 4,677,682 of Miyagawa issued June 30, 1987; 4,707,843 of McDonald et al. issued Nov. 17, 1987 and 4,481,667 of Price et al. issued Nov. 6, 1984.

There are certain functional inadequacies and problems with the known credit card counters. Specifically, although the Dynetics® credit card counter sold by applicant's assignee prior to the card counter of this invention has had and continues to enjoy substantial commercial success, it too has certain shortcomings which have not been overcome in competitive card counter designs. One disadvantage with known credit card counters is associated with preset number selection. The prior card counters are provided with means for preselecting a preset number to which the actual count of a full box of cards is compared. This is done to verify accuracy of the count in a box when the number of cards which sould be in the box is already known. The only way to preselect the preset number or to change the preset number was by means of a manual thumb wheel rotary switch for each of the three digits of a typical preset number, such as the number five hundred. Disadvantageously, such thumb wheel switches are not only expensive, they are somewhat awkward to use and prone to mechanical failure.

SUMMARY OF THE INVENTION

It is therefore an object of the present invention to provide a card counter and associated card inventory systems and methods of using same which overcomes the foregoing disadvantage of known card counters noted above.

First, it is an objective to provide a card counter and inventory system which automatically provide long term storage of inventory control information on hard copy on site or at remote locations and without manual intervention. With a printer option, inventory control information is automatically printed on a dedicated printer under direct control of the card counter based on short term inventory information stored in an electronic memory. With a computer communication option, either with or without the printer, the card counter is provided with means of transmitting the card inventory information stored in short term memory of the card counter directly to a remote or local relatively permanent memory. Preferably, that permanent memory is directly usable with a computer central processing unit and, of course, the inventory information is transmitted by the card counter in conventional computer code. The computer is then used for producing display and hard copy of card counter operation inventory records for days, weeks or even years.

Regardless of whether the information is printed out on site under control of the card counter or whether it is permanently stored on computer compatible storage media, the object of reducing the main problems of transcription errors and intentional falsification of inventory records is obtained. This object is achieved in various ways.

First, a card inventory recording system is provided which comprises a card counter, means for controlling the operation of said card counter including a memory for automatically, temporarily storing preselected card inventory information in response to operation of said card counter and means for generating printer control signals for causing the printer to print said temporarily stored card inventory information. A printer connected with the printer control signal generating means prints said temporarily stored card inventory information directly in response to said printer control signals to create a permanent hard copy record of same.

Secondly, a method of keeping an inventory recording of cards is provided comprising the steps of counting the cards with an electromechanical card counter, automatically, temporarily storing preselected card inventory information in an electronic memory of the card counter in response to the counting of cards by the card counter, causing a printer to automatically print a hard copy of said inventory information for permanent record keeping and erasing the electronic memory of said temporarily stored inventory information after said inventory information has been printed.

Thirdly, a card counter having a sensor for detecting cards and means for counting cards is provided with a computer interface assembly comprising means for temporarily storing inventory information relating to the cards counted, a data output connector for connection to a data input port of a remote computer and means for communicating said temporarily stored inventory information to said data output connector for transmission to said data input port for permanent storage by a memory associated with said remote computer.

Fourthly, this first objective is achieved through provision of a card count inventory system comprising a card counter including means for counting cards and means for temporarily storing card count information while said card counter is energized, means for encoding said temporarily stored count information, a remote, relatively permanent memory for long term storage of temporarily stored information from said card counter after the card counter is de-energized, means for transmitting said encoded, temporarily stored count information to said remote memory for relatively permanent storage thereof and a computer associated with said memory for selectively retrieving said relatively permanently stored count information.

More specifically, it is an object of this invention to eliminate the need for mechanical switches, such as thumb wheel rotary switches or their electronic equivalent for preselecting the preset number to which the final count of each box is compared for verification. This is accomplished by provision in a card counter with a new preset memory system and method of setting or selecting the three digit preset number which avoids the use of such know switches entirely and insures that the correct preset number is selected.

The preset memory system for preselecting said preset number comprises a preset memory for recording said preselected number and a preset data entry system including means responsive to said cards counting means for selectively causing the number of cards actually counted to be entered into said preset memory as the preset number. Also, provided is a new method of preselecting and storing a preset number comprising the steps of counting with said counting means a preselected number of cards equal to a new preset number desired for entry into the preset memory and selectively causing said new preset number counted by said counting means to be entered into storage in the preset memory.

BRIEF DESCRIPTION OF THE DRAWINGS

The foregoing objects, features and advantages will be explained in greater detail and other objects, features and advantages will be made apparent from the following detailed description of the preferred embodiment which is given with reference to the several figures of the drawing, in which.

DETAILED DESCRIPTION

Figure 1:
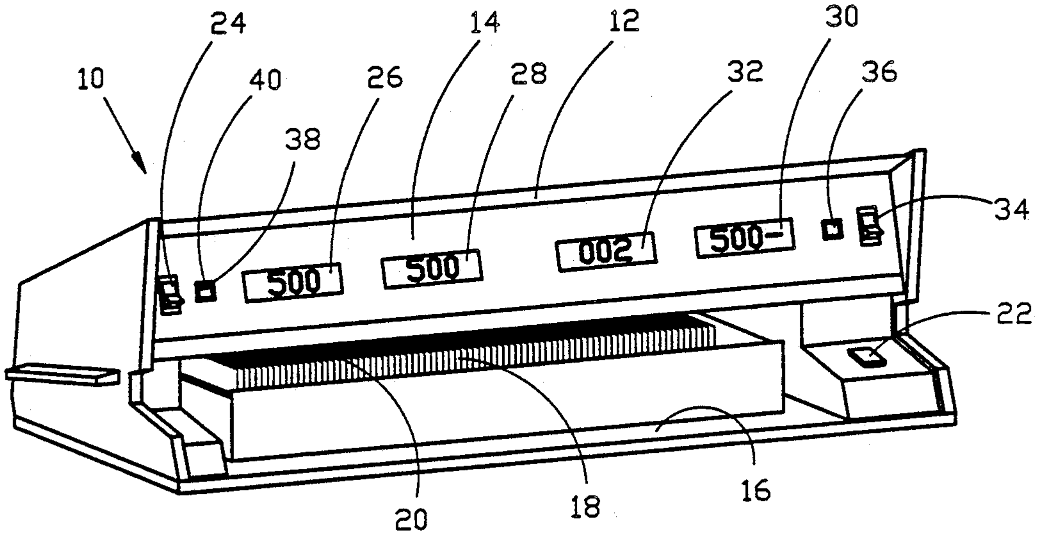
FIG. 1 is a perspective view of a preferred embodiment of the card counter of the present invention.

Referring to FIG. 1, the card counter 10 of the present invention is seen to comprise a low profile housing 12. A control panel 14 at the front of the unit provides mounting for a plurality of control switches and electronic alphanumeric display units used for operating the card counter 10. The cards 18, such as plastic credit cards, are customarily stacked in a box 19 on edge and then placed into a card shelf 16. The box 19 is slid atop the card shelf 16 to a position in which the top edges 20 of the cards 18 are underlying and aligned with an elongate scan track located beneath and behind the control panel 14. A pair of scanning sensors are caused to move along the track by a sensor drive mechanism as will be described in detail below with reference to FIGS. 9A and 9B. The scanning sensors are driven along the scanning path defined by the scan track to optically detect the top edges 20 to produce card detect pulses, one for each card, which, after noise filtering, are counted and stored. This scanning and counting operation, or scan cycle, is initiated each time a scan button switch 22 is actuated, and the power switch 24 is in a power on position.

The various counting totals are indicated on a plurality of substantially identical, electronic, alphanumeric display units. The count of the first, or left, and second, or right, scanning sensors are displayed on suitable first and second card count displays 26 and 28 at the end of each scan cycle. The accumulated card count of a plurality of boxes 19, i.e. the accumulated card count and the total number of boxes of cards 18 which have been counted to obtain the accumulated card count, i.e. the box count, are shown on the accumulator display units 30 and 32. These counts are accumulated when an accumulator control switch 34 has been actuated into an accumulator on position. The memories associated with the accumulator display units 32 and 34 can be cleared in response to operation of the scan switch 22 after being enabled by successive actuations of an accumulator clear switch 36.

One of the two remaining operator controls is a preset control switch 38 with an associated preset indicator lamp 40, preferably an LED, that is lit when the preset control switch is in a preset on state. As will be explained below with reference to FIGS. 2, 5 and 6, when the preset switch is on, count verification includes comparing the actual final card counts for each box with a preselected preset number. The preset number is the standard number of cards that are supposed to be in a box, such as the number five hundred.

A precount verification function operates automatically each time the operator scans a box of cards with a label containing precount information indicia and detects a start code. As will be described below with reference to FIGS. 2 and 13, operation of the precount verification function will cause a precount sensor, FIG. 11, to optically or otherwise read an indicia of a previous card count which is affixed to the box of cards for comparison with the actual count and, if in an on state, with the preset number, for purposes of count verification.

Figures 1, 2:
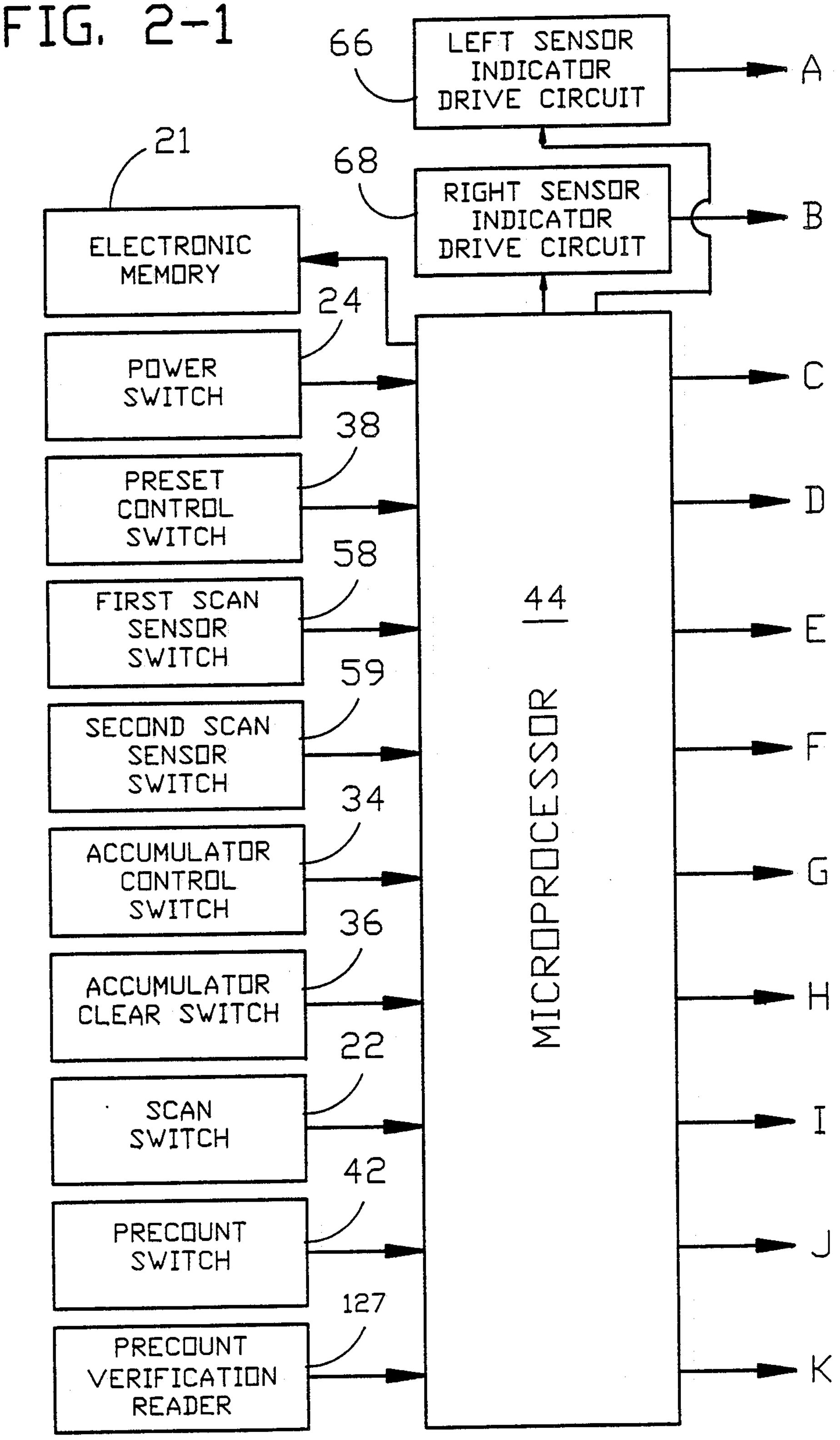
FIG. 2 is a schematic block diagram of the control circuit of the card counter of FIG. 1.
Figure 2:
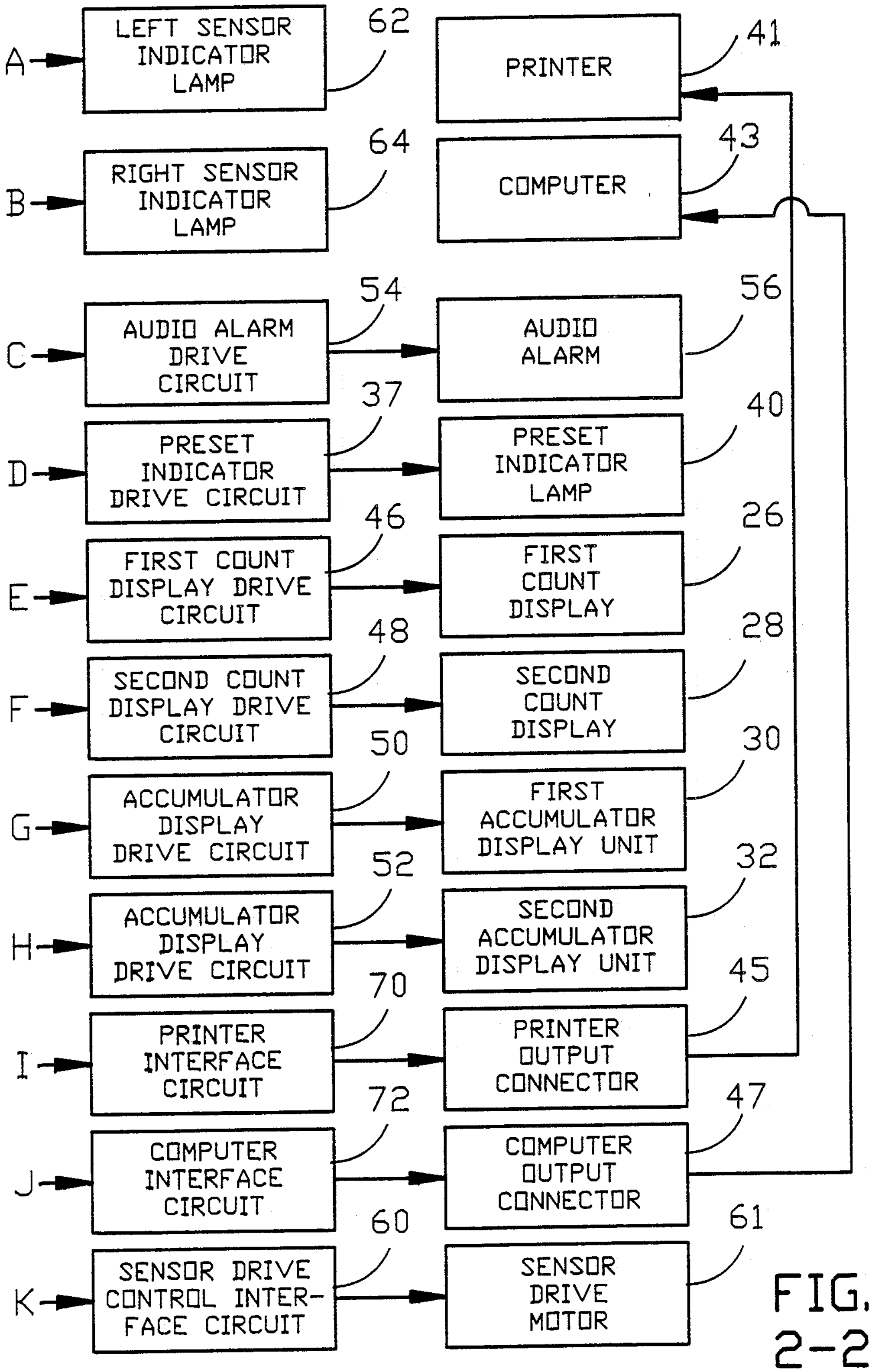
Figure 8:
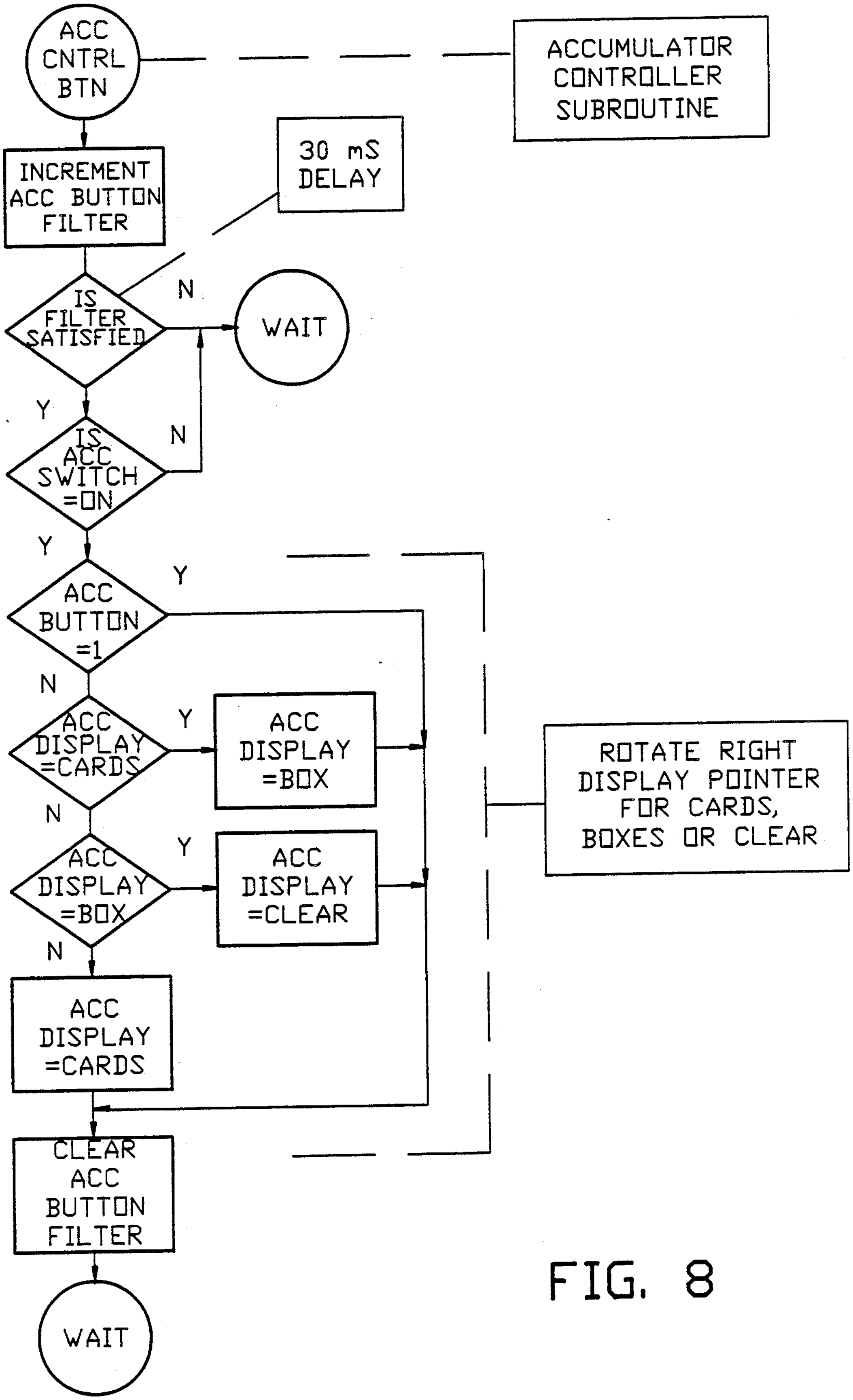
FIG. 8 is an algorithm of an ACCUMULATOR CONTROLLER SUB-ROUTINE.

Various ones of the operator control switches perform additional functions, and the card count displays 26 and 28 and the accumulator displays 30 and 32 are used to provide messages to the operator concerning the status and operation of the card counter 10. Referring also to FIG. 2 and the flow card of FIG. 5A, if neither a printer 41 nor a computer 43 are connected with associated printer output connector 45 and computer output connector 47 and selected for operation, once power is turned on through manual actuation of power switch 24, a microprocessor 44 causes a first count display drive circuit 46, a second count display drive circuit 48, the first accumulator display unit 30 and the second accumulator display unit 32 to show the numeral eight in all alphanumeric locations for several seconds. Afterwards, the microprocessor 44 under control of a program flow charted in FIG. 5A will then cause an audio alarm drive circuit 54 to sound an audio alarm 56 to signal the operator that the card counter 10 is ready for use. The microprocessor 44 under control of the program flow charted in FIG. 5B then causes the first card count display 26 to display "PrE", and the second count display 28 is caused to display "500", which is the standard preset number, under control of an accumulator controller sub-routine flow charted in FIG. 8. The accumulator card count and box count displays 30 and 32 are caused to show either "ACC ON" or "ACC OFF" depending upon the position of the accumulator control switch 34.

With the accumulator control switch 34 in the on position, the microprocessor 44 is enabled to accumulate and store the accumulated card and accumulated box counts in accumulator memories which are a part of its random access electronic memory. When the accumulator control switch 34 is in an off position, the operator may still use the card counter 10 to count cards, but the card and box counts will not be added to the card count and box count accumulator memories. More importantly, any count totals stored in the accumulator memory are not cleared merely in response to turning off the accumulator function. Accordingly, any totals which were stored in the accumulator memory when the accumulator control switch 34 is turned to the off position are held in the accumulator memory and are not lost. When the accumulator control switch 34 is returned to the on position, the totals which were in the accumulator memories when turned off will reappear on the accumulator display units 30 and 32. Preferably, when one accumulator memory is disabled, another one is enabled so inventory of two different groups of cards may be taken concurrently.

According to the invention, a method of concurrently taking inventory of different groups of cards by using a single card counter 10 can thereby be achieved. This is done by first enabling the accumulator to add the number of cards in each box of a first group of cards to be added to the amount stored in the accumulator card memory associated with accumulator displays 30 and 32 while the counter is being used for an inventory of the first group of cards. When it is desired to also count cards of a second group without first ending the inventory taken of the first group of cards, the accumulator card memory is disabled by actuation of the accumulator control switch 34 into its off position. The card counter 10 is then used to count a second group of cards 18 while the accumulator card memory remains disabled. After the second group of cards 18 has been counted and recorded (by recording the card count displayed on card count displays 26 and 28 for each box of the second group or by storing them in a second accumulator memories) the accumulator control switch 34 is then turned back on to again enable the accumulator to accumulate counts of the first group of cards. The card counter 10 is then used to resume counting of the first group of cards. If a second accumulator memory is provided, it is preferably enabled when the first accumulator is disabled and vice versa.

In keeping with another aspect of the invention, the accumulator clear switch 36 performs multiple control functions. One of these enables an operator to "back out", or deduct, the last card count and last box from the accumulator memories respectively associated with accumulated card count and accumulated box count shown on displays 30 and 32. A last count memory portion of the electronic memory of microprocessor 44, or last count memory, continues to temporarily store the last card count after entry thereof into the card accumulator memory until the next scanning cycle. The microprocessor 44 causes the count in this last count memory, which may comprise either the left or right card count memories, to be deducted from the card count accumulator memory in response to the accumulator clear switch 36 being held in an actuated state for a preselected time period longer than normal actuation, such as two seconds. At the end of the time period, the last card count is deducted from the total in the card count accumulator memory and the box count accumulator memory is reduced by one, and the audio alarm is briefly actuated to indicate same. Once a count has been "backed out" of the accumulator memory, it cannot be added back except by recounting the box of cards. In other words, the microprocessor 44 prevents the "back out" function from being performed more than once per scan cycle. Once the next scan cycle has been completed, it is again possible to deduct the last count.

A method is thereby provided for correcting an inadvertent mistake of adding to an accumulated total of one group of cards, a card count from different group of cards. This is done by storing the last count of each of a succession of card counts after accumulation of the last count and then deducting the last count from the accumulated total in the event of detecting that the last count was the count for a box of cards of a group of cards not to be accumulated with the group of cards previously counted. The operator then resumes counting and accumulating cards of the group to be accumulated without error and without beginning anew which could otherwise be required.

Figures 1, 9A:
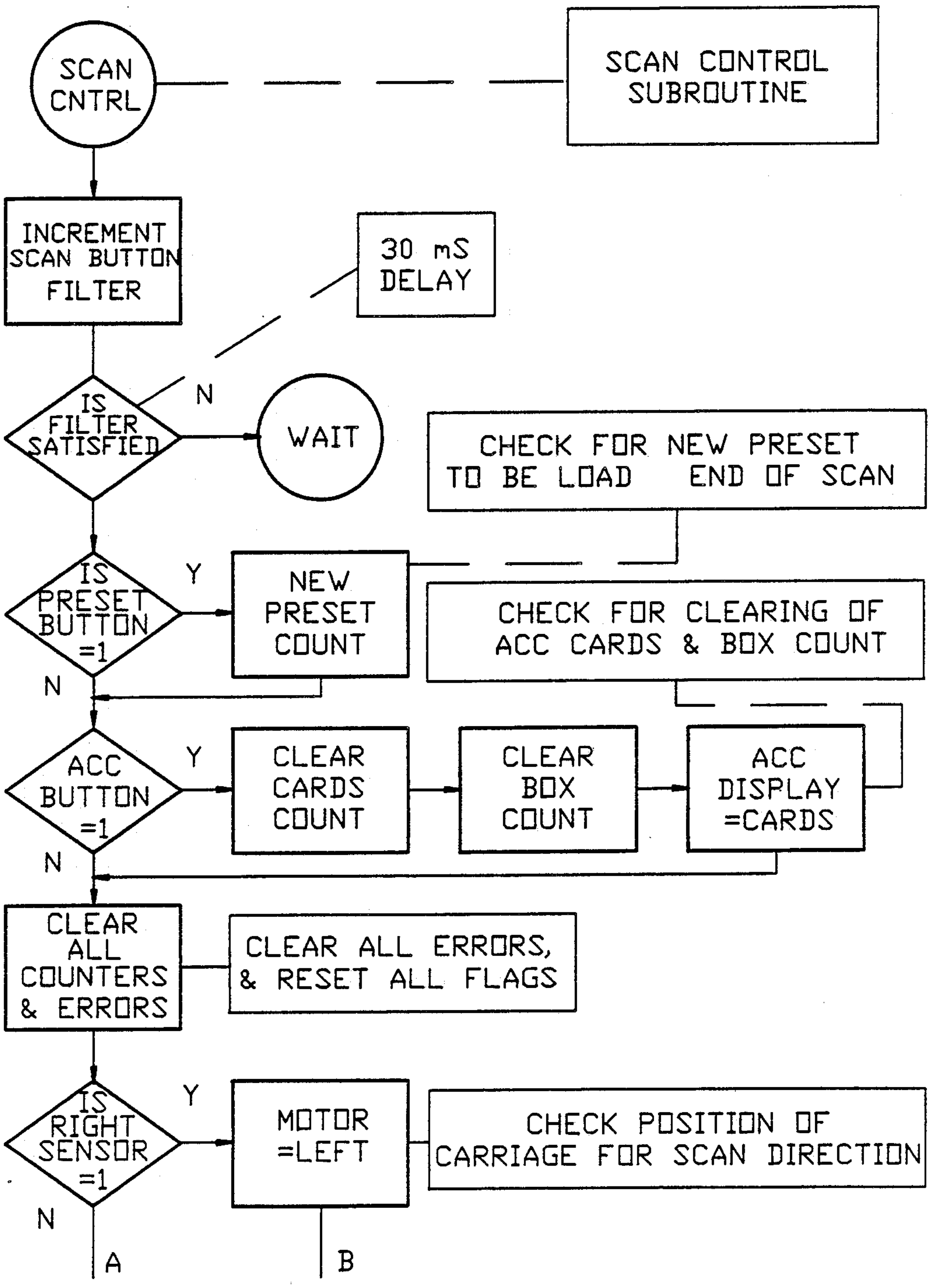
FIGS. 9A and 9B are an algorithm of a SCAN CONTROL SUB-ROUTINE.
Figures 2, 9A:
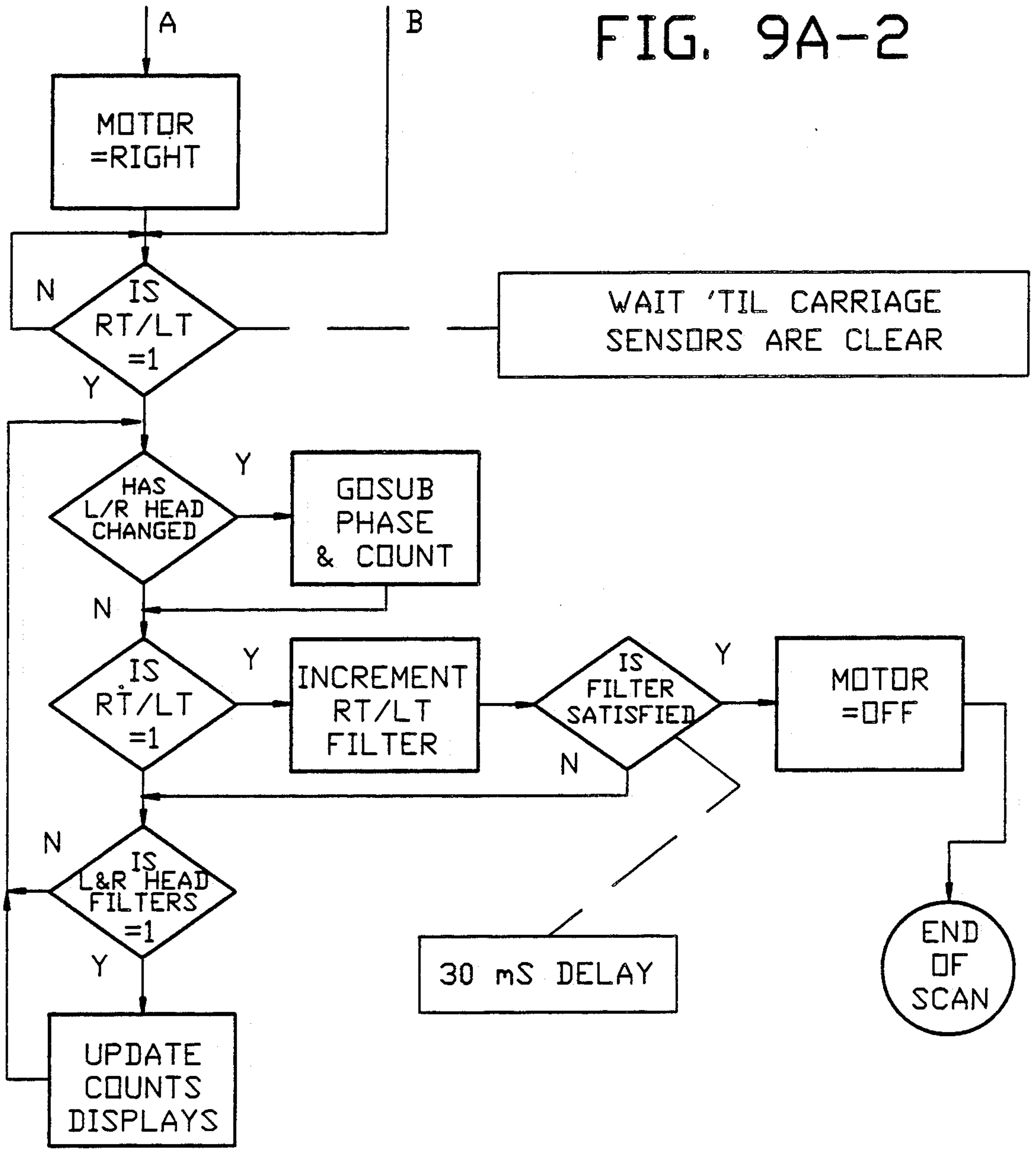
Figure 9B:
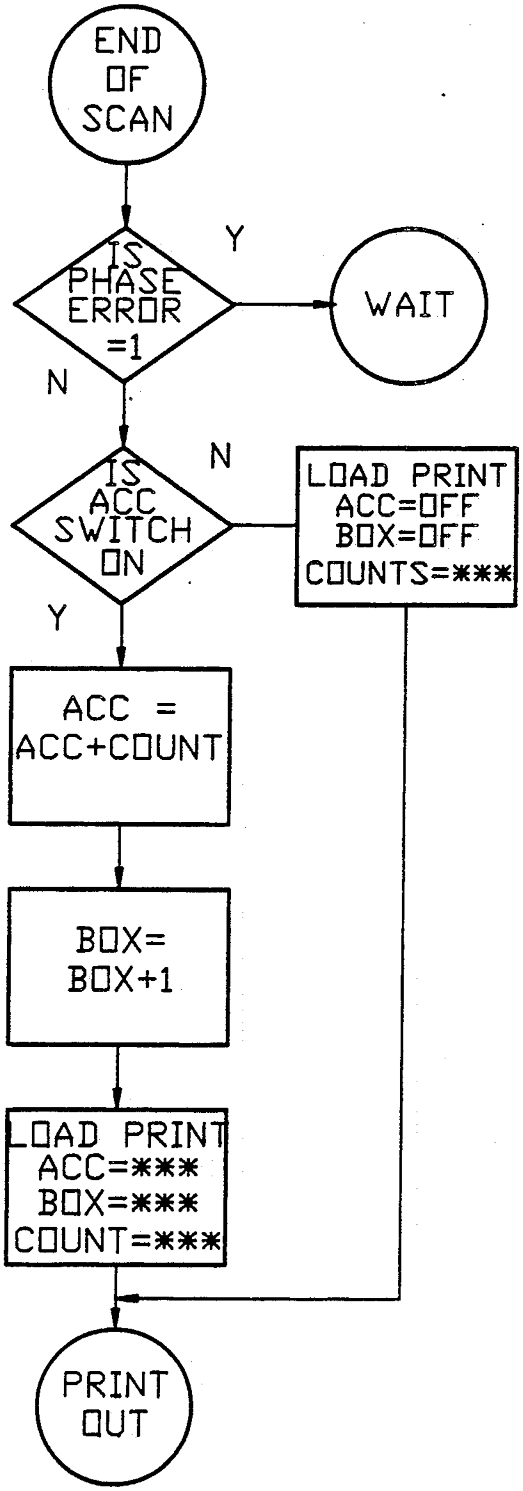

Referring also to FIGS. 9A and 9B, the accumulator clear switch 36 performs additional functions. If it is repetitively actuated and then deactuated before the lapse of the preselected time period, it will cause display of the accumulated totals up to a count of 999,999 and then enablement of clearing of the accumulator memories in response to actuation of the scan switch 22. If the accumulator clear switch 36 is again temporarily actuated, the microprocessor 44 causes the accumulator displays 30 and 32 to show the accumulated box count. If the accumulator clear switch 36 is momentarily actuated while the box count is being displayed, the microprocessor 44 enables the accumulator memories to be cleared and causes the accumulator displays 32 and 34 to show all zeros to indicate same. However, the accumulator memories, although enabled to be cleared under these conditions, are not actually cleared until the scan switch 22 is actuated to scan a new box of cards 18 while the memories are enabled for clearing. The card count 10 may be recycled to the card count display mode by again momentarily actuating the accumulator clear switch 36, before actuation of the scan switch 22.

Performing these multiple actuations of the clear switch 36 plus actuation of the scan switch 22 advantageously reduces the chances of inadvertent clearing of the accumulator memories. Once the scan switch 22 is pressed, when all zeros are showing in accumulator displays 32 and 34, then and only then are the accumulator memories cleared and can no longer be recalled. In that event, at the end of the scan, the new accumulated card and box counts are displayed. A method of card inventory taking is thereby recommended which requires the above multiple steps of multiple switch actuations in order to clear accumulator memories in an automated card counter.

Figure 6:
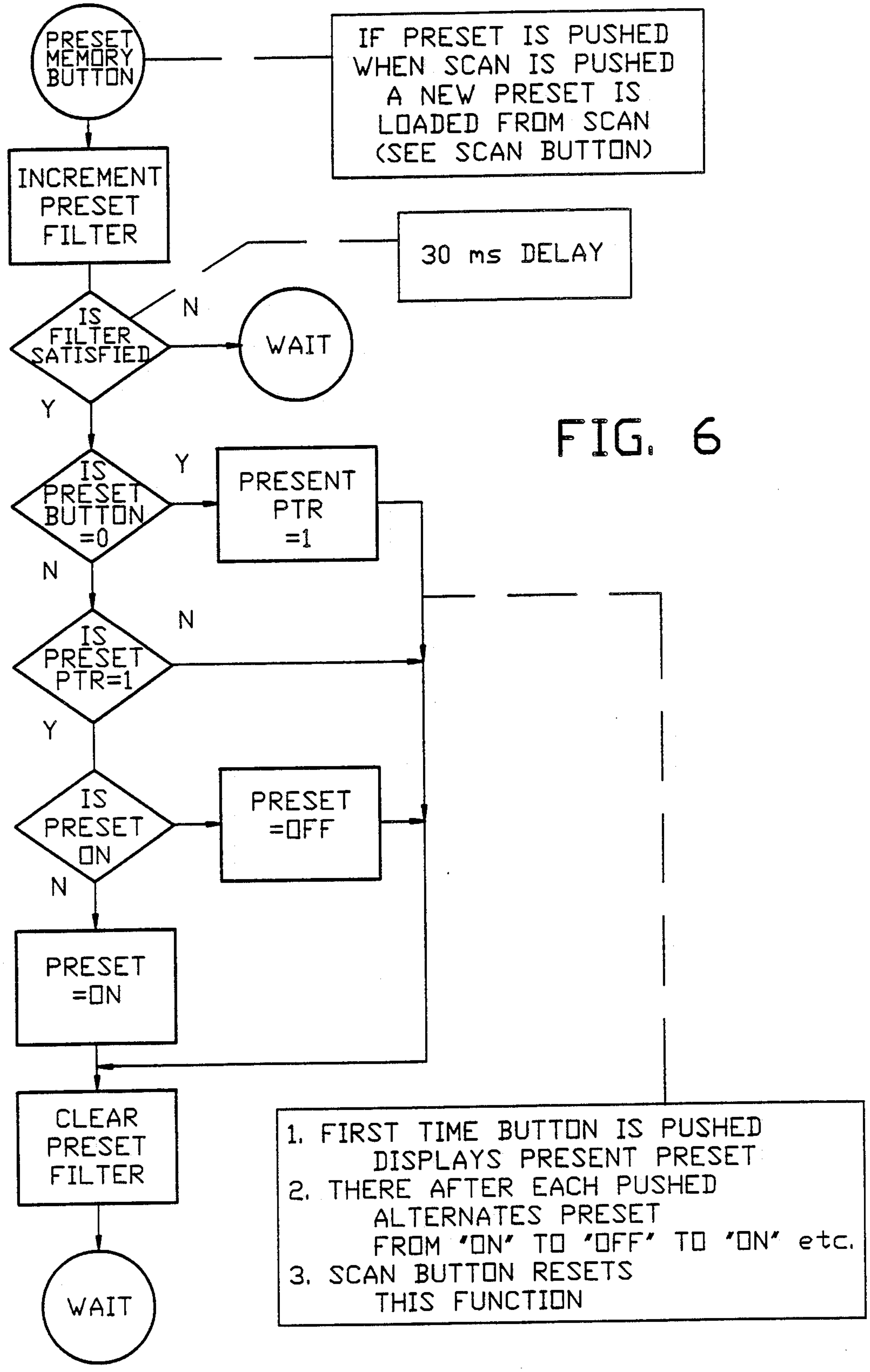
FIG. 6 is an algorithm of a PRESET MEMORY SYSTEM SUB-ROUTINE.
Figure 7:
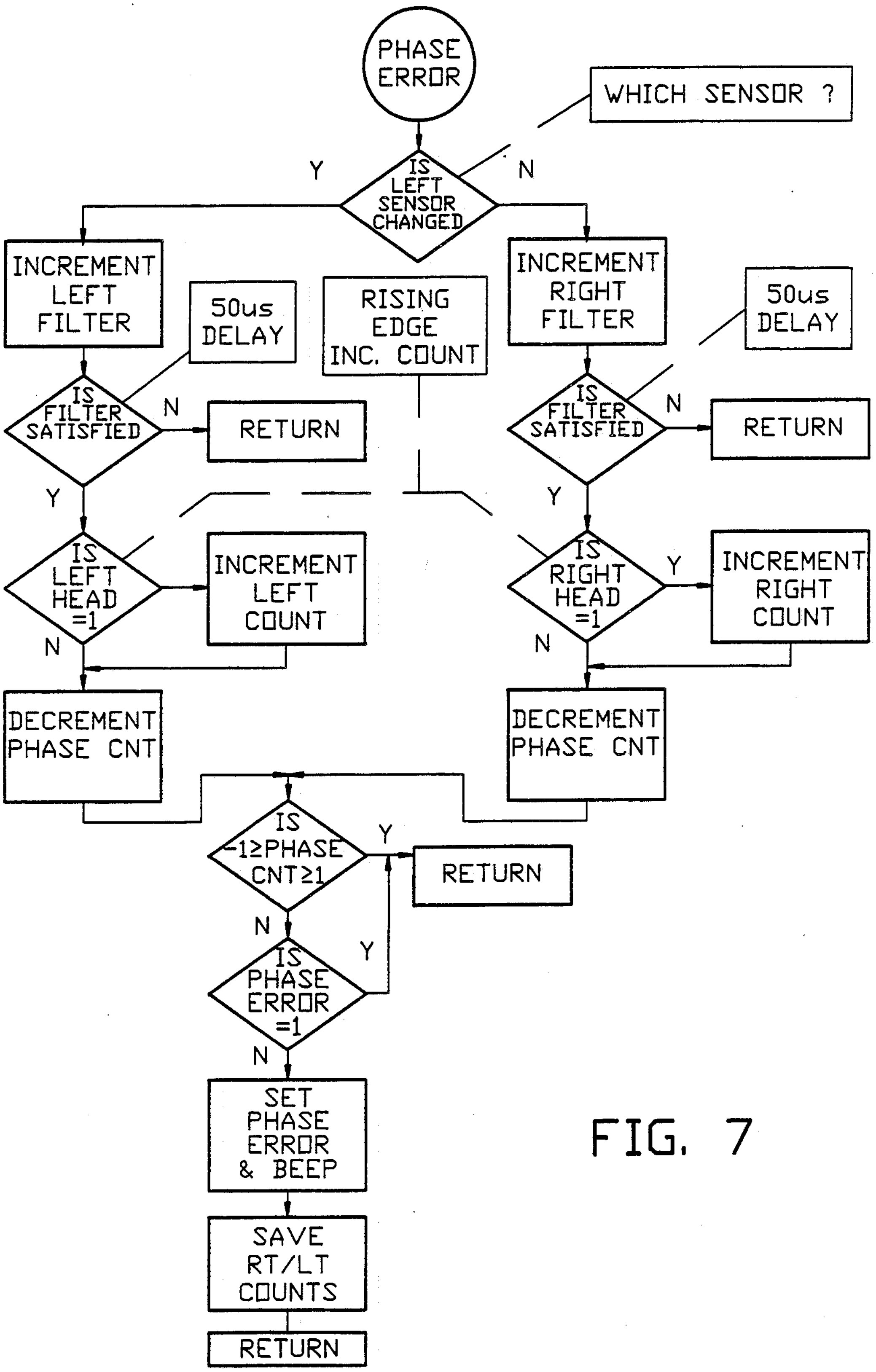
FIG. 7 is an algorithm of a PHASE ERROR DETECTION SUB-ROUTINE.

Referring also to FIG. 6, another advantageous feature of the invention is the manner in which a preset number, other than the standard preset number, is preselected. This is accomplished through actuation of both the preset control switch 38 and the scan switch 22, when the preset function has been selected by actuation of the preset control switch 38 to cause the preset indicator drive circuit 37 preset indicator lamp 40 to light, or turn on. When the preset control switch 38 is on, the audio alarm 56 is sounded in the event the card count of any box 19 does not match a preset number stored in a preset memory of the microprocessor 44. If the preset is on and the audio alarm 56 is caused to sound, the microprocessor 44 also prevents the card count form bieng added to the card count accumulator memory and the number one from bieng added to the box count accumulator memory. Both the left card count and the right card count must match the preset number when the preset is on. In addition to the preset indicator lamp 40, the first time the preset control switch 38 is actuated, the microprocessor 44 shows the on or off status fo the preset and the preset number on the card count display units 26 and 28. The second actuation of the preset control switch 38 causes the preset funciton to change status.

When the power switch 24 is first actuated, the microprocessor 44 automatically causes a standard preset number, such as five hundred, to be entered into a preset number memory portion of its electronic memory 21, or preset memory 21. If the operator chooses to change the preset number to enable counting and card count accumulation of a different number of cards per box 19, the number in the preset memory is changed through actuation of the scan switch 22 to count a box of cards 18 into the preset memory. A preset data entry system controlled by the microprocessor 44 causes the card counting circuits associated with the first and second scan sensor circuits 58 and 59 to selectively cause the number of cards to be counted during a scan cycle to be entered into the preset memory as the preset number. This is achieved by holding the preset control switch 38 in an actuated state when the scan switch 22 is actuated to count a box of cards 18. Once the scanning cycle begins, both the scan switch 22 and the preset switch should be released. After the scan cycle is completed, if both the left count and right count shown on card count display units 26 and 28, respectively, match, then the card count will be entered into the preset memory as the preset number. The new preset number can then be displayed to the operator by actuating the preset control switch 38 and keeping it actuated. The microprocessor 44 will then cause the preset number to be shown by the first card count display unit 26. When the preset control switch 38 is released, the card count displays 30 and 32 then return to showing left and right card counts for the box 19.

Thus, an advantageous method of entering a new preset number into a preset memory comprising the steps of counting a preselected number of cards equal to a new preset number desired for entry into the preset memory and selectively causing the count of said counting means to be entered into the preset memory as the preset number.

If the operator wishes to use the card counter 10 to count boxes of cards 18 where the quantity will vary from box to box, the preset function is turned off by actuating the preset control switch 38 twice in succession. If the preset is off, it can likewise be turned back on by again actuating the preset control switch 38 twice in succession. The preset memory is not cleared when the preset function is turned off, so when it is turned on, the preset number will be the same as when it was last turned off.

Referring also to FIG. 9A, the microprocessor 44 responds to actuation of the scan switch 22 to apply motor control signals to a sensor drive control interface circuit 60 which, in turn, energizes a bi-directional sensor drive motor 61 to scan left or scan right across the top edges 20 of the cards 18. A left sensor indicator lamp 62 located at the left hand side of the left card count display 26 is caused to light when the scan cycle has been completed and the sensors are on the left side of the track. A right sensor indicator lamp 64 is caused to light when the scan cycle has been completed in the reverse direction and the sensors are at rest on the right side of the track. These sensor indicator lamps 62 and 64 are respectively driven by left and right sensor interface circuits 66 and 68, respectively. Neither sensor lamp is on during the scan, and also all switches are disabled during the scan.

When it is desired to count only a small number of cards, it is recommended that the cards be placed on the one side of the card shelf 16 marked by the one sensor indicator lamp 62 or 64 which is lit. A card count can be done without a box 19 by placing the cards 18 on the card shelf and against the appropriate end wall and holding them standing up straight with an index finger while the scan switch 22 is actuated to scan the cards.

The card counter 10 is capable of counting any laminated credit card without any color restriction except that gold cards must contain a white core stock in order to be counted. The card tray and sensor track are designed to receive cards measuring up to a maximum size of 2.125 inches by 3.375 inches and a maximum box length of 18.250 inches. Shorter boxes may be used without necessity for adjustment, and smaller cards may be counted with an optional adapter (not shown).

In order to insure accurate counting of cards, there are certain procedures which should be followed. Cards should be counted in the supplier's box or the equivalent. Box edges should be ¼" below top of card. Regardless of the number of cards being counted, it is especially important that all cards face the same direction, are positioned straight, upright, reasonably square, and well seated in the box. For an accurate count, a view of top surface of cards 18 in the box 19 should not reveal visible ragged edges. When counting embossed cards in the supplier's box, all cards should face the same direction and be positioned straight and upright. If the box 19 is less than full, the cards should be positioned so that the debossed, or back sides of the cards 18 are pressed against one end of box 19. The operator index finger is used to maintain the cards in a straight and upright position. When counting a small handful of cards out-side of the box 19, the cards should be placed against one end of the front opening to the card shelf 16. Light pressure with an index finger can be used to hold cards straight and upright. If cards are embossed, the cards should be positioned so that all are facing the same direction with debossed (back) sides against one end of the front opening. The counter detects the space between the cards, so the cards should not be compressed while being counted. When counting cards in a box wrapped in plastic, the plastic should be tight and free of all flaws and wrinkles.

Card count accuracy is also enhanced by provision of a count verification system including a phase error detector. The microprocessor 44 has means for comparing the first and second card counts during the scan cycle and before the first and second final counts are reached. In the event the counts of the first and second card counts differ from one another during the scan cycle, a phase error is detected. In such event the microprocessor 44 responds by disabling the card count accumulator and box count accumulator from receiving the final counts even if they match, i.e. are equal. The phase error is indicated by showing on the card count display units 26 and 28 the intermediate counts of the left and right sensor 58 and 59 when the phase error occurred.

Card count accuracy is also improved through provision of a filter between the sensors and the input to the microprocessor 44 which filters out both pulses which are too small or which do not occur at the proper time during the scan cycle. The filter preferably comprises an amplitude detector and a pulse timing detector. The amplitude detector is connected between the sensors and the counter and preferably comprises a Schmitt trigger circuit which passes pulses only during the time they exceed a preselected minimum threshold amplitude. Referring to FIG. 9A again, the pulse timing detector is programmed into the microprocessor 44 to pass the amplitude detected pulses to the counter only if they meet certain preselected timing characteristics. These timing characteristics preferably include a minimum pulse width which is approximately four hundred microseconds.

Figure 5A:
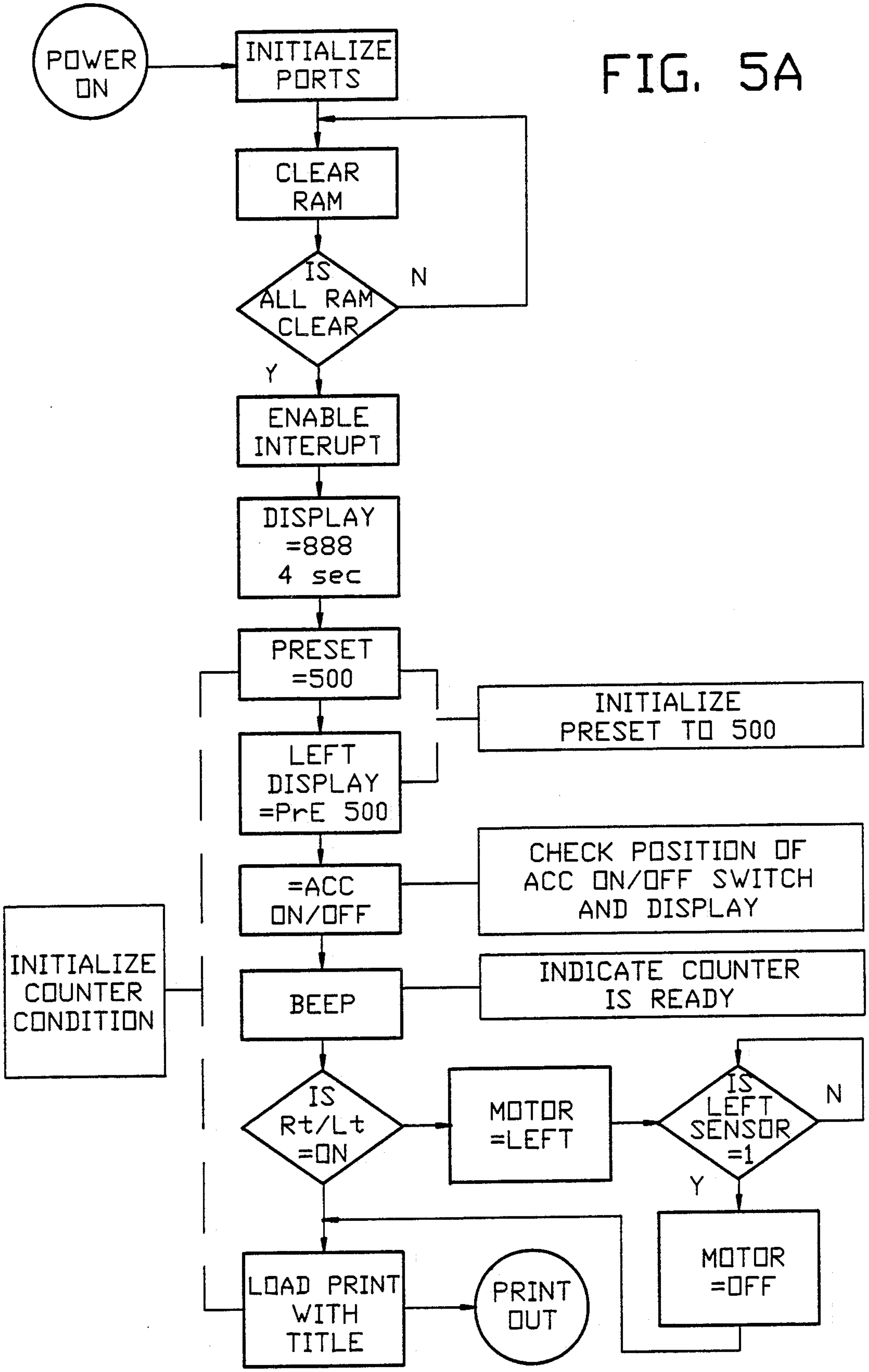
FIGS. 5A and 5B comprise an algorithm, or flow chart, of the preferred computer program used by the microprocessor of the control circuit of FIG. 4 during power-up when power is first applied including a self-diagnostic sub-routine.
Figures 1, 5B:
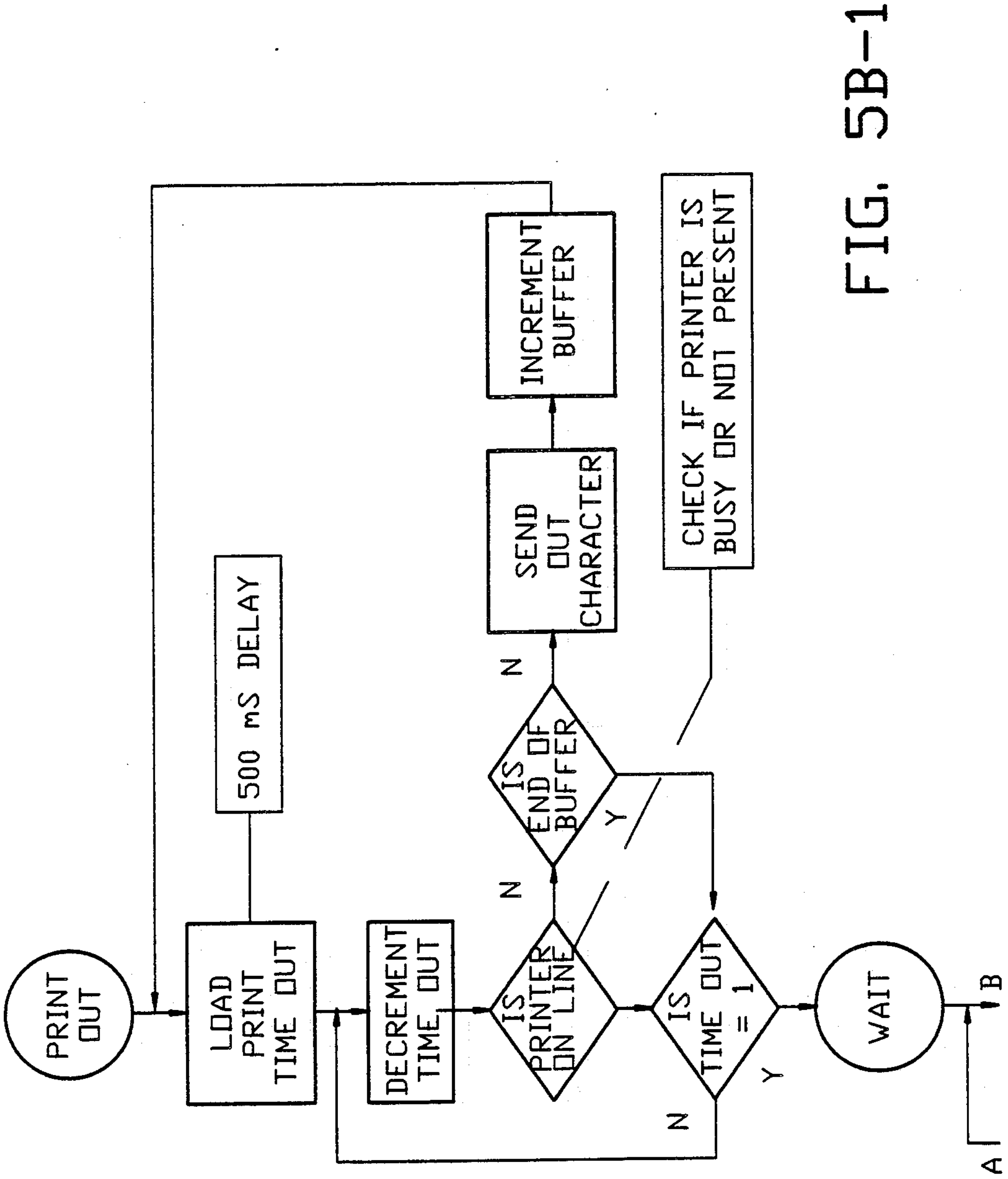
Figures 2, 5B:
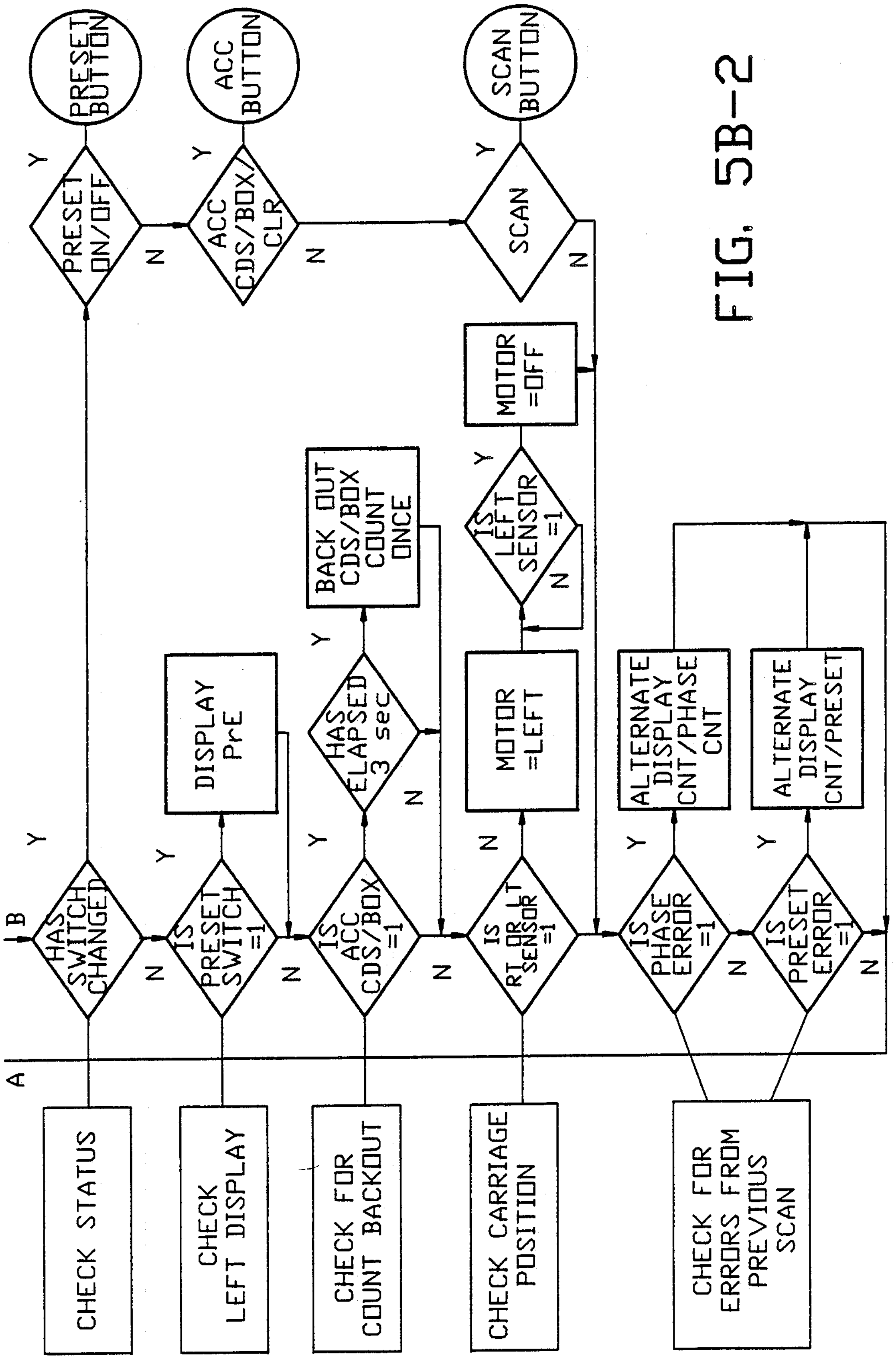

As already noted and shown in FIGS. 5A and 5B, count accuracy and reliability are also advantageously enhanced by a self diagnostic system which checks a variety of essential card counter functions each time the power switch 24 is turned on. Specifically, the random access electronic memory, the input/output ports, the display units 26, 28, 30 and 32, the audio alarm 56, the printer interface 70 and the computer interface 72 are all checked.

Many of the objectives of this invention are achieved through provision of means associated with the microprocessor 44 for providing data and control signals for automatic operation of a system. These signals are provided by a printer interface circuit 70 to the printer output connector 45 at a proper level for driving printer 41 when releasibly connected therewith. Likewise, a computer interface circuit 72 provides data and control signals from the microprocessor 44 to the computer output connector 47 at a proper level to drive a computer 43. In both instances, communication is established pursuant to the standard R.S. 232 interface protocol. The microprocessor 44 is operated in accordance with the flow chart of FIG. 5B to communicate with the printer 41, FIG. 3. The flow chart (not shown) of the program for communication with the computer 43, FIG. 3, is substantially the same as that for the printer.

Figure 3:
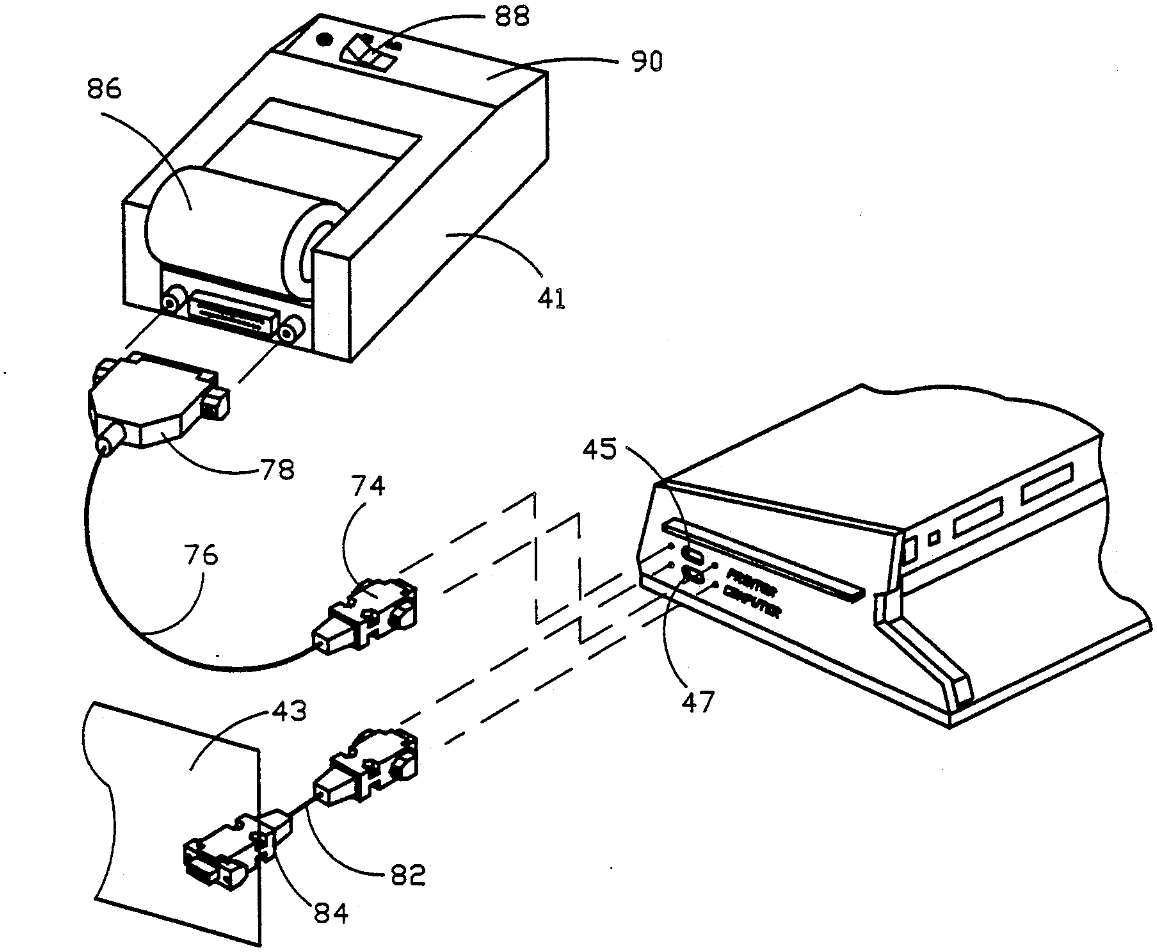
FIG. 3 is a perspective view of an enlarged portion of the counter of FIG. 1 shown connected with a printer and with a remote computer.

Referring to FIG. 3, both the printer output connector 45 and the computer output connector 47 are seen to preferably comprise releasible multipin connectors. Printer output connector 45 is coupled through a mating female connector 74, cable 76 and a male connector 78 to remote printer 41. Computer output connector 47 is similarly connected to computer 43 through a male connector 80, cable 82 and female connector 82. The printer can be any type of printer with remote controlability and having a replenishable roll of paper 86 and a printer on/off switch 88 all mounted to a housing 90 within which the printer mechanism and circuitry are contained. The computer 43 may be any small business or personal computer with magnetic memory such as an AT TM or a PC TM computer sold by International Business Machines.

When the printer is connected, the power up procedure is somewhat different than when there is no printer as explained above. First, the printer on/off switch must be turned on which will cause it to print the word "READY". The printer is then ready to receive data from the microprocessor 44. The power switch 24 is then turned on which causes all displays to show all eights for approximately five seconds while the self-diagnostic program is run by the microprocessor. At the same time the printer is printing the following heading:

DYNETICS ® PC 5300
POWER TURNED ON
OPER TYPE
DATE TIME

After a preselected time period, the printer will stop printing and the microprocessor 44 will cause the audio alarm circuit 54 to sound the audio alarm 56 to signal the operator that the unit is ready for use.

Preferably, the printer also has an internal self-diagnostic feature to verify that it is functioning properly. In order to initiate the self-diagnostic test, the on/off switch 88 is held in the on position until the printer starts to print. The printer will then print a sequence of symbols, numbers and letters for a period of approximately two minutes which will indicate if there is any defect.

Figure 4:
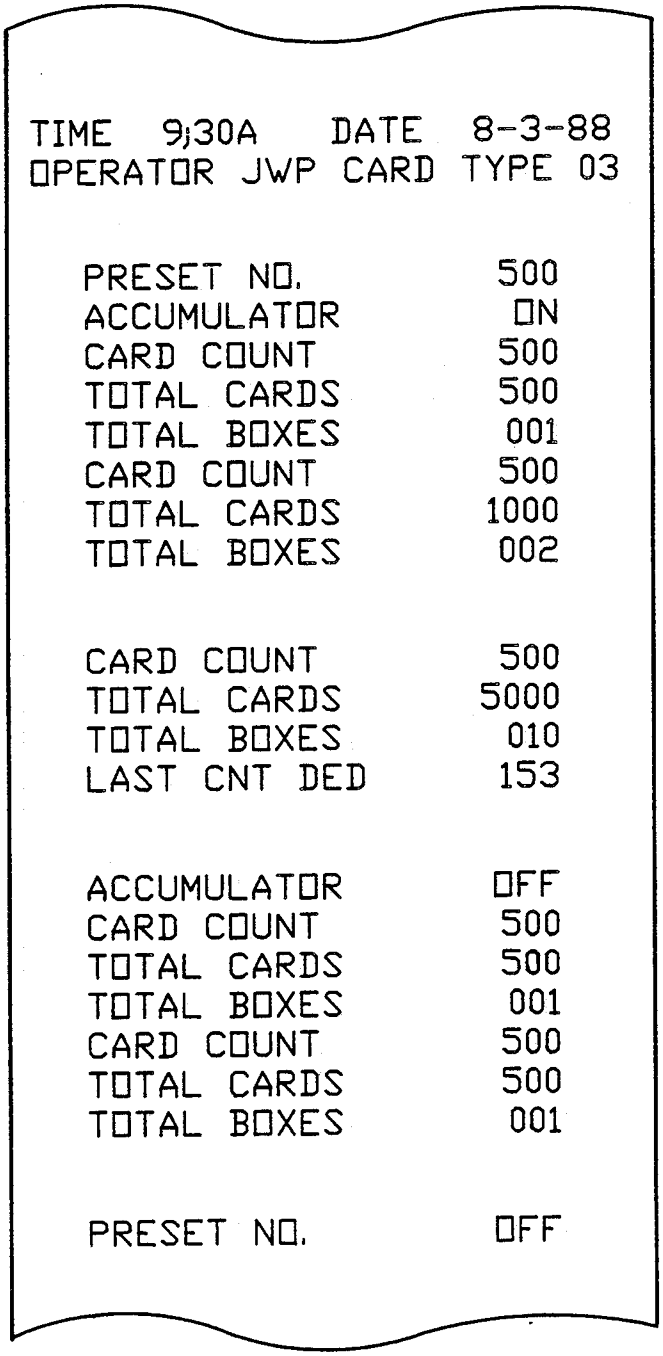
FIG. 4 is an illustration of the type of card counting information caused to be printed by the card counter.

Referring to FIG. 4, the microprocessor 44 through means of data and control signals applied to printer interface circuit 70 causes the printer 41 to print out for each box of cards counted, i.e. for scan cycle, the status of the accumulator function, the preset number and status of the preset function, the card count for the scan, the total cards counted in the card count accumulator and the total boxes counted in the box count accumulator. Once this inventory information has been printed, the temporary accumulator members can be cleared in the manner described above, if desired. The amount, if any, "backed out", or deducted from the accumulator memories is also indicated. Similarly, the same inventory information which is printed by the stand alone printer 41, when conveyed through the computer interface circuit 72 and computer output connector 47, a permanent magnetic memory associated with the computer 43 can be employed to permanently store this inventory information.

Thus, it is seen that a card inventory recording system is provided for obtaining card count inventory information and storing that inventory information both temporarily and permanently, this system includes means for controlling a card counter for obtaining and temporarily storing card count inventory information and then causing that inventory information to be stored permanently by printing a hard copy of same. After the hard copy is printed or the inventory information is stored permanently on a magnetic disc or the like, the accumulator memories are cleared or erased for use in subsequent accumulations.

Advantageously, if the inventory information is stored in a relatively permanent memory associated with the computer 43, then the computer 43 is used to retain this information and to manipulate it for preparation of summaries and other inventory reports. Also, the computer can control its own printer to print the same inventory information printed by the printer 41.

Figure 10A:
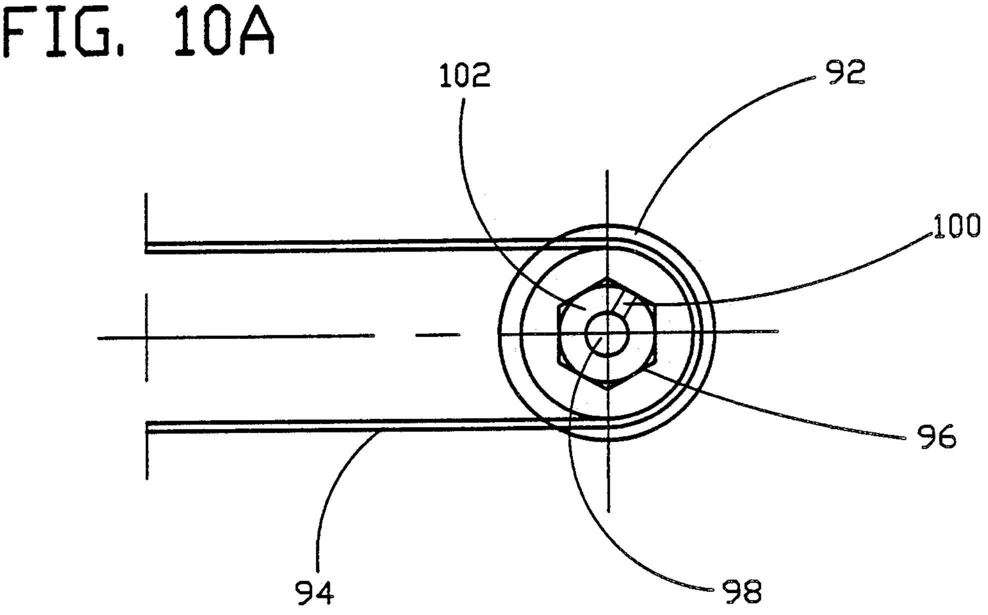
FIGS. 10A and 10B are side and top views of the preferred embodiment of a segment of the overload protected sensor drive mechanism used in association with the SCAN CONTROL SUB-ROUTINE of FIGS. 9A and 9B.
Figure 10B:
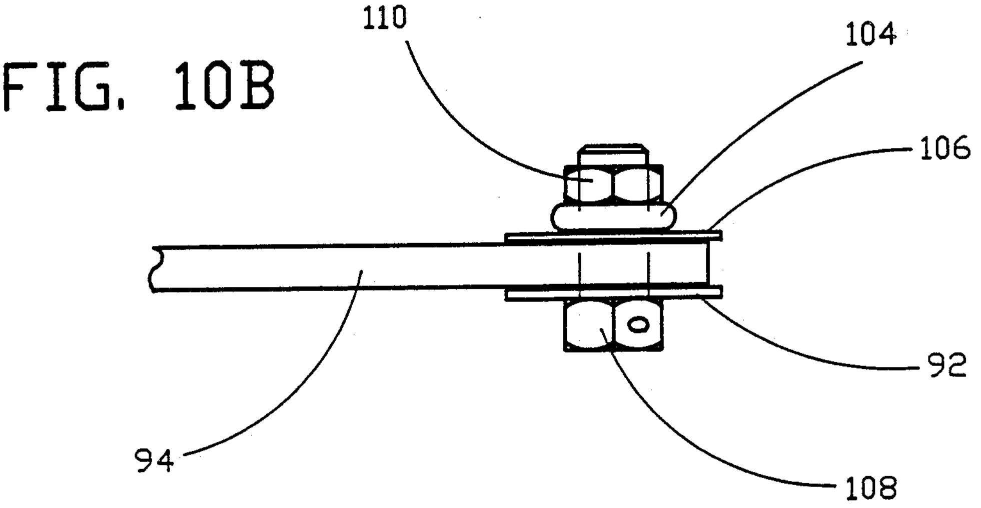

Referring to FIGS. 10A and 10B, the overload protected sensor drive mechanism controlled via the scan control sub-routine of FIG. 9A includes a pair of pulley wheels 92 (only one shown) interconnected through a pulley belt 94 of which the scanning sensors of scan sensor circuits 58 and 59 are mounted. The cards are located the pulley belt 96 which defines the scan path travelled by the sensors when the pulley wheel 92 is rotated. The pulley wheel 92 is mounted for axial rotation about the shaft of a pulley bolt, or drive member, 96 which loosely extends through a central axle hole therethrough. The bolt member 96 is connected to the motor shaft 98 of a sensor drive motor 61 by means of a set screw 100 and collar 102.

Referring to FIG. 10B specifically, the slip clutch of the present invention which protects the motor against overload from a stall condition when the sensors reach the end of the scan path includes a resilient O-ring 104. The O-ring 104 is pressed against the side 106 of the pulley wheel 92 by means of a hexagonal adjustable nut 108 which is adjustably threaded to a free end of the pulley bolt 96. By tightening or loosening the adjustable nut 108, the O-ring 104 is squeezed more or less between the side 106 and the head 110 of the pulley bolt 96 to more or less frictionally engage the pulley wheel 92 and pulley bolt to rotate together. Preferably an adjustment is made to allow relative movement, i.e. slippage, when the torque applied thereto exceeds a preselected torque which is below a level that would cause excessive loading to the motor 61, such as can occur when the motor is stalled.

Figure 11A:
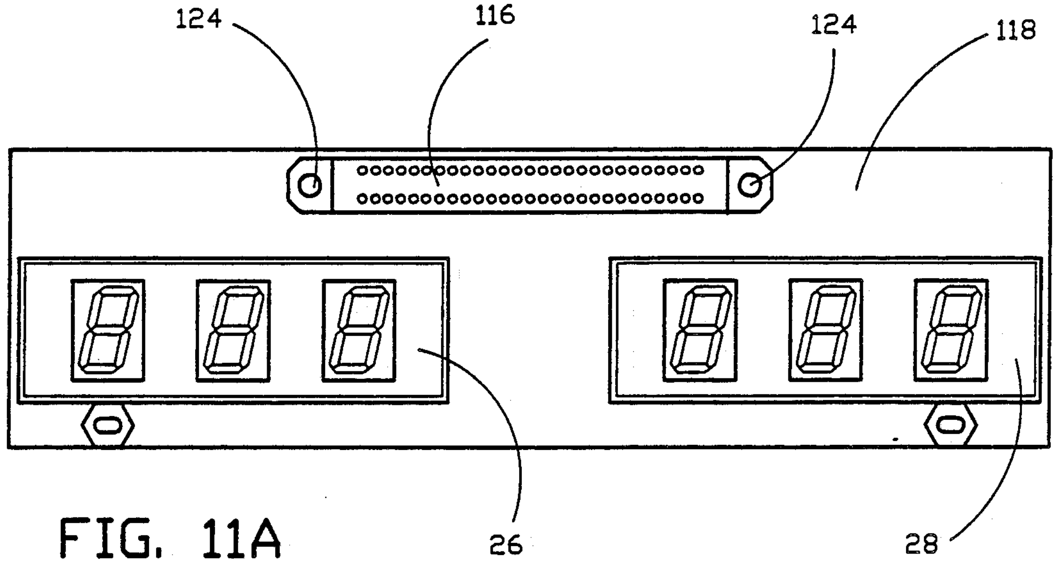
FIGS. 11A and 11B are front and side views illustrating the mounting details of the display units of the card counter of FIG. 1.
Figure 11B:
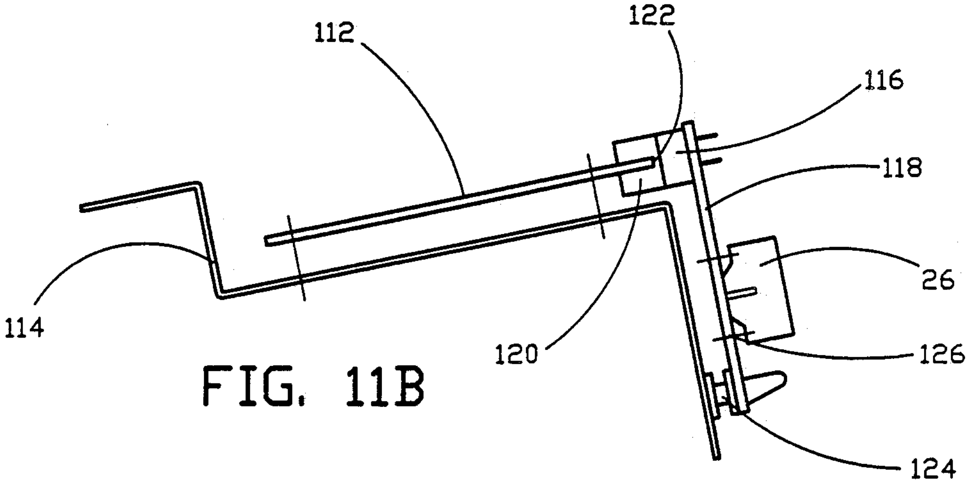

Referring now to FIGS. 11A and 11B, another advantageous feature of the card counter 10 of the present invention is the display unit mounting assembly for both electrically connecting and mechanically mounting the display units, such as left and right card count display units 26 and 28, to a printed circuit board 112 containing the control circuit of FIG. 2. The printed circuit board 112 is fixedly mounted to a frame member 114 of card counter 10. This dual function is achieved by means of a first multiline electrical connector 116 secured to an inner side of a display unit mounting board 118 which interconnects with a mating, second multiline electrical connector 120. The second multiline connector 120 is mounted to a forward edge 122 of printed circuit board 112 and faces in a direction substantially parallel to, and aligned with, the plane of the printed circuit board 112. The first connector 116 faces in a direction substantially transverse to the plane of the display unit mounting board 118. Accordingly, when the first and second connectors are electrically interconnected, the display unit mounting board 118 is mechanically interconnected to the edge of the printed circuit board 112. Alternately, the first and second connectors are integrally formed as a single card edge connector releasibly connected to the printed circuit board 112. Since the printed circuit board 112 is mounted in a substantially horizontal condition, as shown, this results in the substantially vertical condition which is desired for the display units 26 and 28, as shown.

The connectors are releasibly but firmly fastened together by means of screws 124, FIG. 11A, such that no other means are needed to mount the board 118 to the frame member 114 in proper position in the housing 12, although additional support can be provided by means of a support leg 124. The display units 26, 28, 30 and 32 are releasibly connected to the display unit mounting board 118 by means of connector pins 126 releasibly received within suitable socket connectors attached to the mounting board 118. They are thereby detachably interconnected with the first connector 116 and the second connector 120 and the control circuit. Thus, a means of easily removing both the display units or the entire display unit mounting board 118 are advantageously provided for easy repair or replacement.

Figure 12:
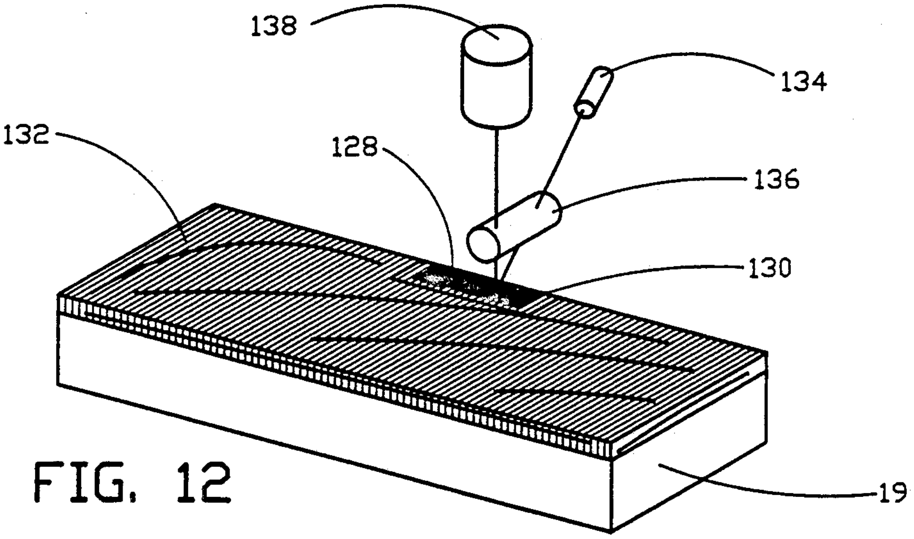
FIG. 12 is an enlarged, perspective, schematic illustration of the precount reading verification sensor of the present invention.
Figures 1, 13:
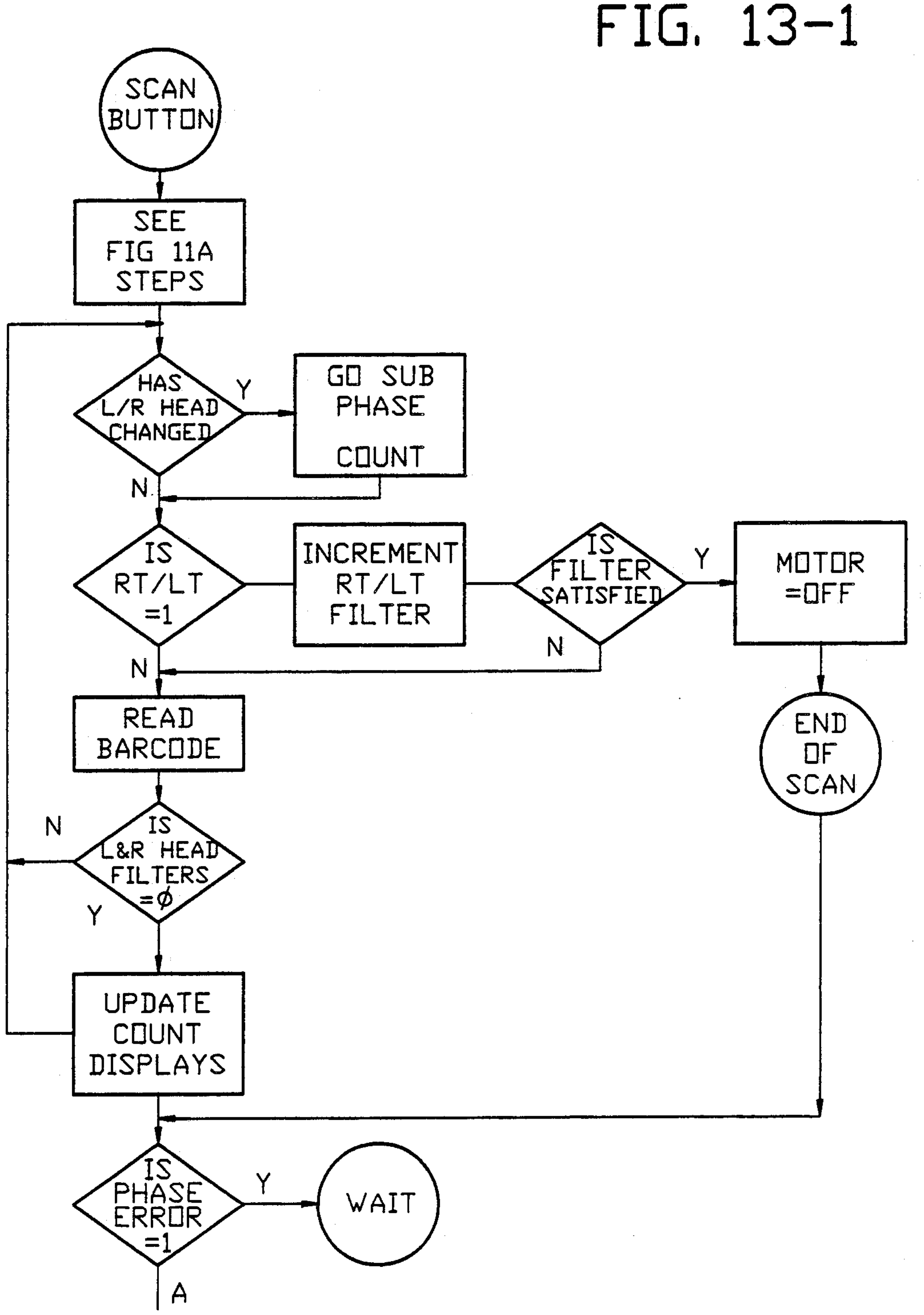
FIG. 13 is an algorithm of a preferred program for the PRE-COUNT VERIFICATION SUB-ROUTINE.
Figures 2, 13:
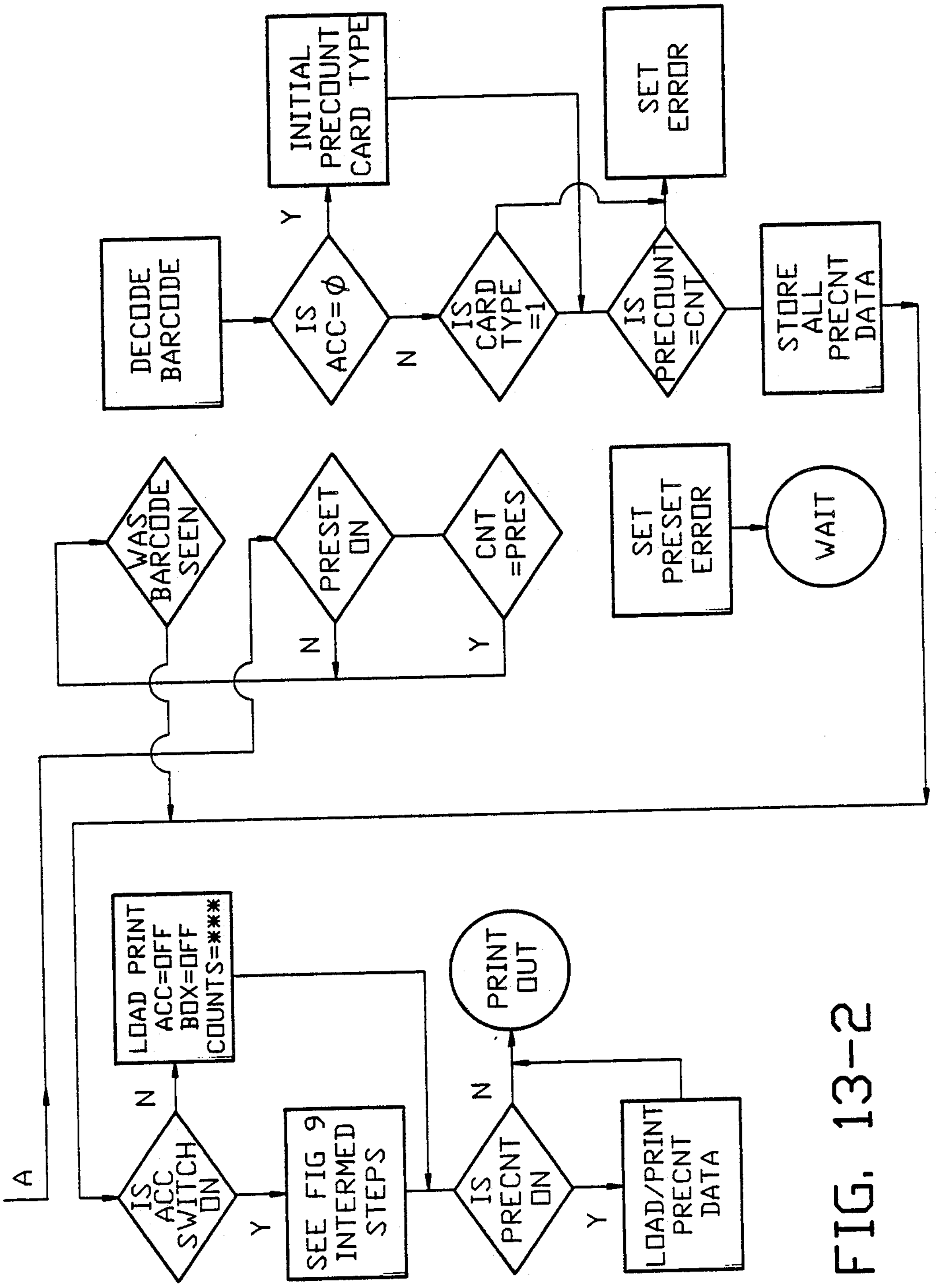

Referring now to FIGS. 2, 12 and 13, preferably the card counter is provided with a precount sensor assembly, or precount verification reader 127 for reading a bar code or other coded indicia 128 of precount inventory information on a precount label 130. In accordance with the invention, the precount label 130 is attached to a box 19 of cards which has been precounted and encased in a plastic shrink wrap 132. The sensor assembly 124 includes a light sensor 134, a light source 138 and a cylindrical lens 136 and produces signals representative of the bar code or other machine readable precount indicia 128 when it scans past the surface of the label 130. The sensor assembly 124 is preferably mounted to move with the pulley belt 94 so it moves across the precount label 130 at the same time that the card counting sensors detect the cards 18.

Referring specifically to FIG. 13, the microprocessor is controlled to use this information to detect a counting error in the event the card count indicated on the precount label 132 does not match the actual count, or recount, performed on the labelled box 19. If there is no match, then an error indication is provided and the count is prevented from being added to the accumulator memory. Preferably, if the precount card count does not match the preset number an error indication is also provided.

Preferably, the precount label has a start code and includes precount inventory information relating to at least one of card type, date of precount and precount operator identification in addition to the precount card count. The precount function is automatically actuated when a start code is first detected. The microprocessor 44 then stores all the above precount and inventory information.

If the accumulator memory is empty, or clear, then the card type is merely stored as being the card type of a first group of cards. Subsequently, each time a new box is counted, the card type read from the precount label 132 is compared with the card type in storage. If there is no match, a counting error indication is provided and accumulation is prevented. If there is a match, the count is accumulated, and count data is enabled for transmission to at least one of a printer and a computer. The printer then prints out both the precount data and the new, or recent, data together.

While the label is shown on top of the box 19, it could also be mounted on the side. In addition, if preferred, it could be mounted at the end of the box and read when the box 19 is manually mounted into the shelf, or the sensor alternatively is provided with its own separate scanning mechanism apart from that for the card count sensor to read a precount label at the end of the box.

Thus, it is seen that a new inventory control system is achieved by providing boxes of cards with precount information thereon in bar code or other suitable machine readable indicia of precount information, comparing that precount information with actual information from a recount and then providing a count error indication if there is no match of information.

While the algorithms and foregoing description should provide sufficient basis to enable anyone skilled in the art to practice this invention, to ensure this is the case with respect to FIGS. 5-9B, attached hereto as Appendix A to this application is a printed listing of a preferred computer program for implementing these flow charts. The same program techniques revealed therein can also be used to implement the sub-routine of FIG. 13.

The foregoing detailed description is a description of only the preferred embodiment and not intended to describe all possible combinations and variations of the inventive aspects thereof. Accordingly, reference should be made to the claims for definition of the scope of the invention contemplated herein.

I claim:

1. In a card counter having means for counting cards, means for storing the number of cards actually counted and means for comparing the number of cards actually counted with a preset number, the improvement being a preset memory system comprising:

a preset memory for recording said preselected number; and a preset data entry system including means responsive to said cards counting means for selectively causing the number of cards actually counted to be entered into said preset memory as the preset number.

2. The card counter of claim 1 in which said preset data entry system includes means for selectively causing the storing means to transfer the count of the number of cards actually counted to said preset memory for storage therein.

3. The card counter of claim 1 including a power switch, and in which said preset memory system has means for automatically entering a standard preset number in said preset memory in response to actuation of said power switch.

4. The card counter of claim 1 in which said counting means includes a scanning sensor and a scan switch for actuating the scanning sensor, and said preset data entry system includes a preset switch for selecting a program mode for said preset memory, and means responsive to actuation of said scan switch when said program mode has been selected to cause entry of the number of cards counted into the preset memory.

5. The card counter of claim 4 in which said preset data entry system program mode is selected by holding said preset switch in an actuated state upon actuation of the scan switch.

6. With a card counter having means for counting cards with means for storing the number of cards actually counted, a preset memory for storing a preset number and means for comparing the number of cards actually counted with the stored preset number, a method of entering a new preset number into said preset memory, comprising the steps of:

counting with said counting means a preselected number of cards equal to a new preset number desired for entry into the preset memory; and selectively causing said new preset number counted by said counting means to be entered into storage in the preset memory.

7. The method of claim 6 in which said preset memory comprises a counter, and said step of entering the preselected number into storage in the preset memory includes the step of enabling the preset memory to count detection pulses from said counting means.

8. The method of claim 6 including the steps of comparing the final counts of at least a pair of counters of said counting means to determine if there is a match, and disabling the selectively causing means from entering the count of either of the pair of counters into the storage in the preset memory, if there is no match.

9. The method of claim 6 including the steps of detecting whether there is a phase error between a pair of card detectors of said counting means, and disabling the selectively causing means from entering the count into storage in the preset memory if a phase error is detected.

10. The method of claim 6 in which said step of selectively causing entry of the count into storage in the preset memory includes the step of enabling the preset memory to receive the count into storage before said step of counting.

11. The method of claim 10 in which said step of enabling includes the steps of holding a preset switch in a program position while a scan switch is actuated to initiate a counting.

* * * * *